(12) United States Patent
Ouyang

(10) Patent No.: US 7,621,319 B2
(45) Date of Patent: Nov. 24, 2009

(54) FERROFLUID-COOLED HEAT SINK

(75) Inventor: Chien Ouyang, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 473 days.

(21) Appl. No.: 11/255,743

(22) Filed: Oct. 21, 2005

(65) Prior Publication Data

US 2007/0089866 A1    Apr. 26, 2007

(51) Int. Cl.
F28D 15/00    (2006.01)

(52) U.S. Cl. ............................ 165/104.33; 165/104.21; 165/104.23; 165/80.4

(58) Field of Classification Search ............ 165/104.33, 165/104.21, 104.23, 120, 80.4; 361/699, 361/704; F25B 21/02
See application file for complete search history.

(56) References Cited

U.S. PATENT DOCUMENTS

| | | | |
|---|---|---|---|
| 2,847,936 A * | 8/1958 | Richter ........................ 417/50 |
| 5,355,942 A | 10/1994 | Conte | |
| 6,108,204 A * | 8/2000 | Brotherton et al. .......... 361/704 |
| 6,408,937 B1 * | 6/2002 | Roy ....................... 165/104.33 |
| 6,410,982 B1 * | 6/2002 | Brownell et al. ............. 257/714 |
| 6,658,861 B1 * | 12/2003 | Ghoshal et al. ................ 62/3.7 |
| 6,766,817 B2 | 7/2004 | da Silva et al. | |
| 6,918,404 B2 | 7/2005 | Dias da Silva et al. | |
| 7,066,586 B2 | 6/2006 | da Silva et al. | |
| 2004/0052048 A1 * | 3/2004 | Wu et al. ..................... 361/699 |
| 2004/0182088 A1 * | 9/2004 | Ghoshal et al. ................ 62/3.7 |
| 2004/0182099 A1 * | 9/2004 | Hsu ......................... 62/259.2 |
| 2005/0139345 A1 * | 6/2005 | Pokharna et al. ........... 165/80.4 |
| 2006/0090474 A1 * | 5/2006 | Sauciuc et al. ................ 62/3.2 |

* cited by examiner

Primary Examiner—Ljiljana (Lil) V Ciric
(74) Attorney, Agent, or Firm—Osha • Liang LLP

(57) ABSTRACT

A heat sink uses thermally conductive ferrofluid to cool an integrated circuit. A direction of flow of the ferrofluid in the heat sink is controlled by a motorized pump assembly. The motorized pump assembly uses a motor to rotate a metal plate to which at least one magnet is connected. The direction of flow of the ferrofluid is dependent on a magnetic field induced between the at least one magnet and at least one magnetic particle in the ferrofluid passing through the motorized pump assembly.

20 Claims, 10 Drawing Sheets

FERROFLUID-COOLED HEAT SINK

BACKGROUND

A computer system 10, as shown in FIG. 1, includes several components that are collectively used by a user to perform various functions such as, for example, preparing and generating a document with a word processor application. With the computer system 10, the user may input data to a computing portion 12 using peripheral devices such as a keyboard 14 or a mouse 16. Data may also be provided to the computing portion 12 using data storage media (e.g., a floppy disk or a CD-ROM (not shown)). The computing portion 12, using memory and other internal components, processes both internal data and data provided to the computing portion 12 by the user to generate data requested by the user. The generated data may be provided to the user via, for example, a display device 18 or a printer 20. The computing portion 12 of a computer system typically includes various components such as, for example, a power supply, disk drives, and the electrical circuitry required to perform the necessary and requested operations of the computer system.

As shown in FIG. 2, the computing portion 12 may contain a plurality of circuit boards 22, 24, 26, 28 (e.g., printed circuit boards (PCBs) or printed wiring boards (PWBs)) on which various circuit components are implemented. For example, a computing portion designed to have enhanced sound reproducing capabilities may have a circuit board dedicated to implementing circuitry that specifically operate to process data associated with the reproduction of sound.

In FIG. 2, the components of exemplary circuit board 22 are shown. A crystal oscillator 30 provides a reference of time to various integrated circuits (ICs) 32, 34, 36, 38, 40, 42 (e.g., application specific integrated circuits (ASICs), field-programmable gate arrays (FPGAs), microprocessors, logic gates) that are connected to the circuit board 22. The integrated circuits 32, 34, 36, 38, 40, 42 communicate with one another, i.e., pass data, using wires or traces of conductive material (e.g., copper (shown, but not labeled)) embedded in the circuit board 22.

In operation, an integrated circuit, such as those shown in FIG. 2, dissipates heat as a result of work performed by the integrated circuit. Energy that is needed by the integrated circuit for work is not consumed with 100% efficiency, thereby resulting in excess energy that is released, among other things, as heat. As integrated circuits become more dense (i.e., more transistors per unit area) and faster (i.e., higher operating frequencies), they generate more heat. As excessive heat is damaging to an integrated circuit both in terms of performance and component integrity, an important design consideration involves ensuring that heat dissipated by an integrated circuit is sufficiently drawn away from the integrated circuit, where the efficiency of drawing away heat from the integrated circuit is expressed in terms of what is referred to as the "heat transfer rate."

"Heat sinks" are devices that are commonly used to cool integrated circuits.

FIG. 3 shows a heat sink 50 as used with an integrated circuit 52 housed in a package 54 atop a substrate 56. The heat sink 50 is made of a high thermal conductivity metal (e.g., copper or aluminum). A "high thermal conductivity metal" is one that allows heat to pass through it because it contains many free electrons.

A base of the heat sink 50 is secured over the integrated circuit 52 by, for example, a retention clip (not shown) or an adhesive or thermal interface material (shown, but not labeled). During operation of the integrated circuit 52, the temperature of the integrated circuit 52 increases due to increased particle movement resulting from a build-up of excess energy. The increased integrated circuit temperature results in an increase in the temperature of the package 54, and consequently, of the heat sink 50. The increased temperature of the heat sink 50 results in an increase in the temperature of the air around the heat sink 50, whereby the heated air rises and effectively draws heat away from the integrated circuit 52. This process is referred to as "convection."

The removal of heat dissipated from an integrated circuit by a heat sink is dependent on numerous factors. For example, the thermal resistance of the package that houses the integrated circuit affects how much heat transfers from the integrated circuit to the heat sink. Also, the effectiveness of the adhesives between the integrated circuit and its package and the package and the heat sink affects how much heat transfers between these components. Moreover, the conductivity of the materials used in the package and the heat sink has a direct bearing on the amount of heat that is transferred away from the integrated circuit. The surface area of the heat sink is also important as more surface area results in more air being heated, thereby resulting in more heat being drawn away from the integrated circuit by the rising heated air.

SUMMARY

According to one aspect of one or more embodiments of the present invention, a computer system comprises an integrated circuit and a heat sink operatively connected to the integrated circuit, where the heat sink comprises: (i) a pipe, and (ii) a motorized pump assembly through which the pipe is arranged to carry ferrofluid, where the motorized pump assembly is arranged to induce a magnetic field with at least one magnetic particle in the ferrofluid, and where a direction of flow of the ferrofluid in the pipe is dependent on the magnetic field.

According to another aspect of one or more embodiments of the present invention, a method of cooling an integrated circuit with a heat sink comprises: rotating a motor operatively connected to at least one magnet; and directing thermally conductive ferrofluid to propagate over a region of the heat sink attached to the integrated circuit in a direction dependent on a magnetic field induced between the at least one magnet and at least one magnetic particle in the ferrofluid.

According to another aspect of one or more embodiments of the present invention, a heat sink comprises: a body portion formed of a plurality of fins arranged to dissipate heat; a motorized pump assembly disposed on a top surface of the body portion; a copper pipe arranged to propagate thermally conductive ferrofluid from the body portion through the motorized pump assembly back to the body portion, where a direction of propagation of the ferrofluid in the copper pipe is dependent on a magnetic field induced between the motorized pump assembly and at least one magnetic particle in the ferrofluid; and a base portion adapted to attach to an integrated circuit.

Other aspects and advantages of the invention will be apparent from the following description and the appended claims.

DETAILED DESCRIPTION

Embodiments of the present invention relate to a heat sink that "cools" an integrated circuit using a ferrofluid (i.e., a fluid containing magnetic particles).

The magnetic particles may have diameters on the order of nanometers (1 nanometer=1 billionth of a meter=$1 \times 10^{-9}$ meters). A motorized pump assembly induces a magnetic field with magnetic particles in the ferrofluid to effectively "drive" the flow of ferrofluid in the heat sink.

Figure 1:
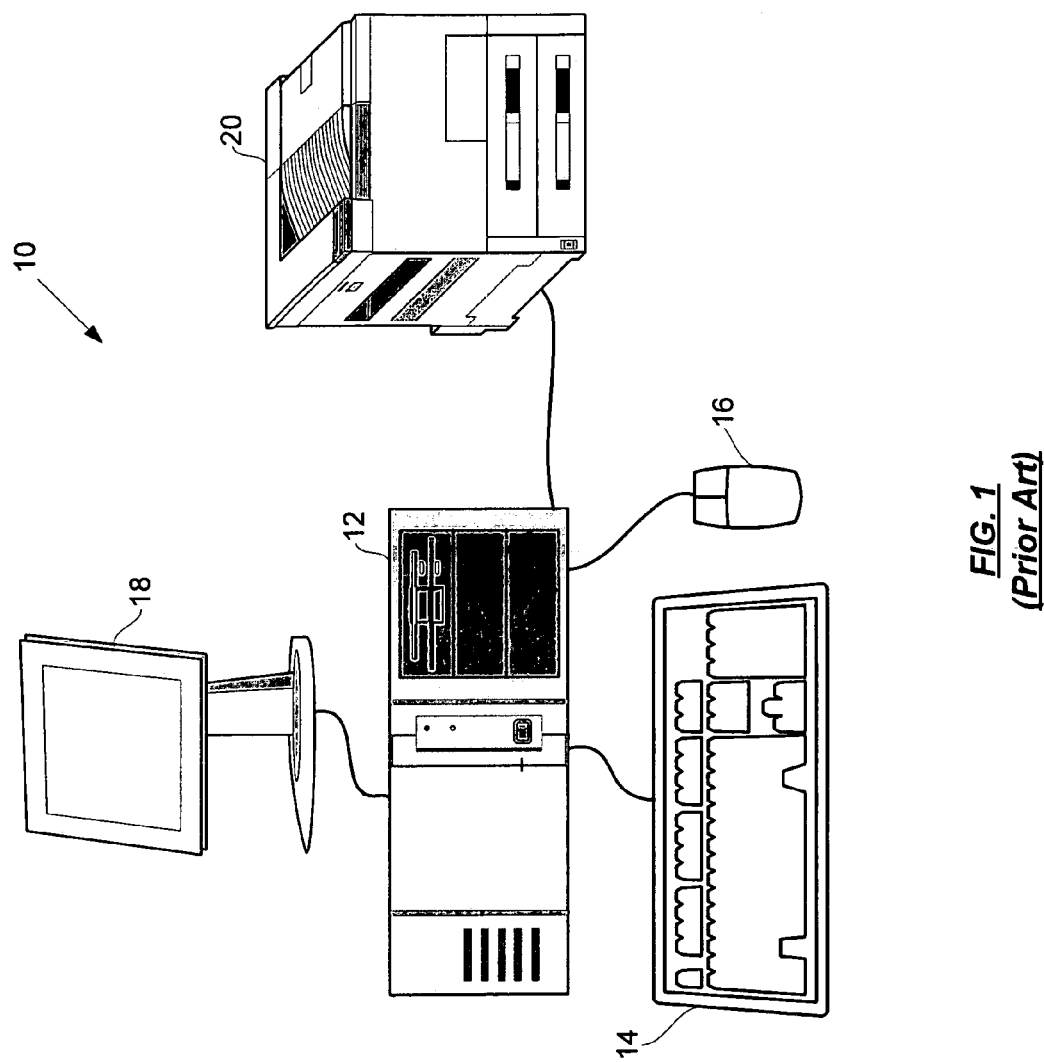
FIG. 1 shows a computer system.
Figure 2:
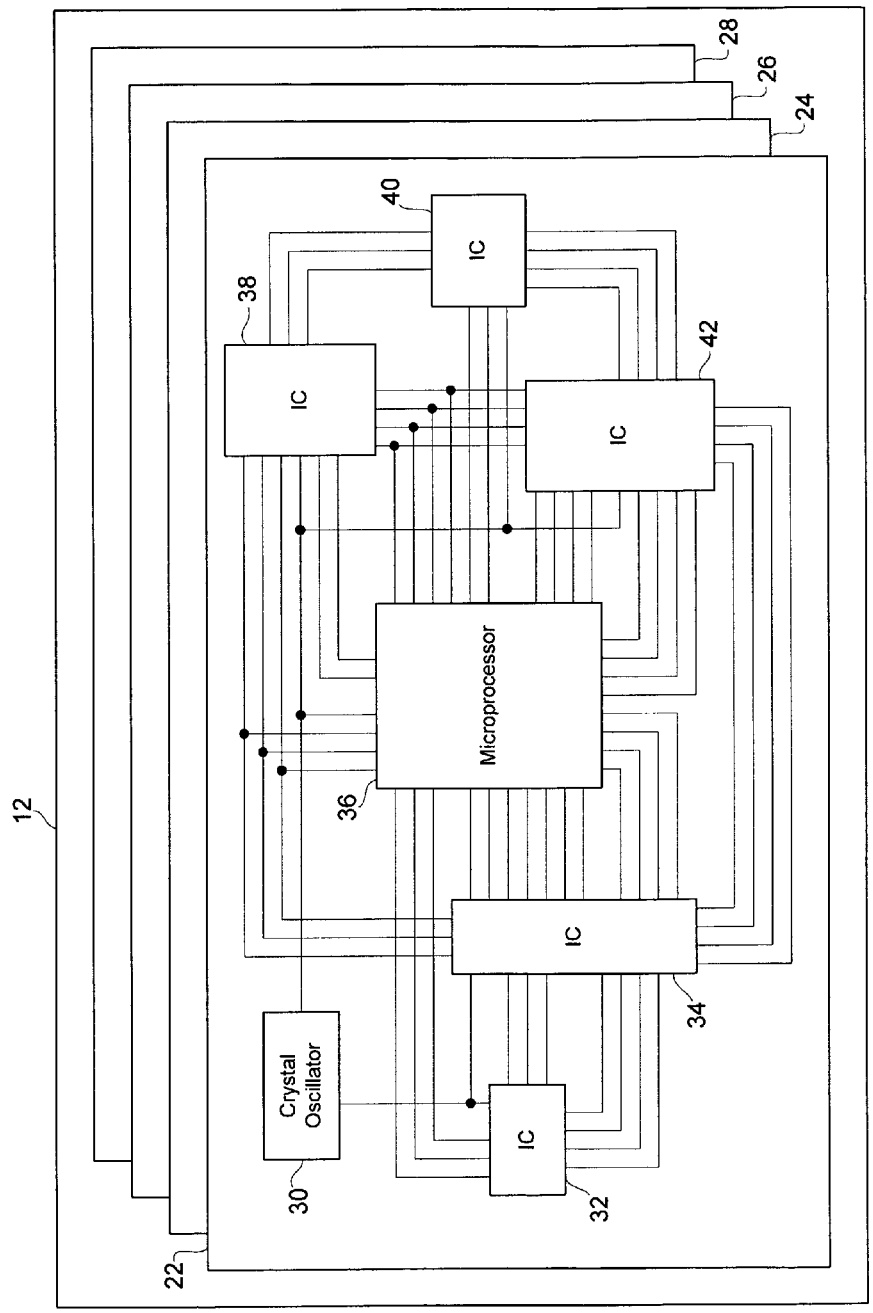
FIG. 2 shows a portion of a computer system.
Figure 3:
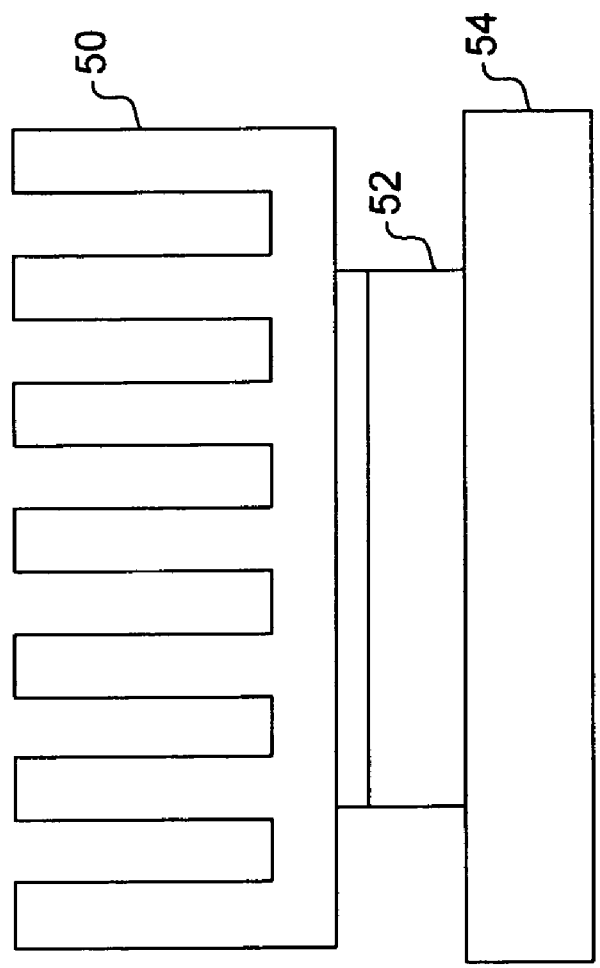
FIG. 3 shows a heat sink as used with an integrated circuit.
Figure 4:
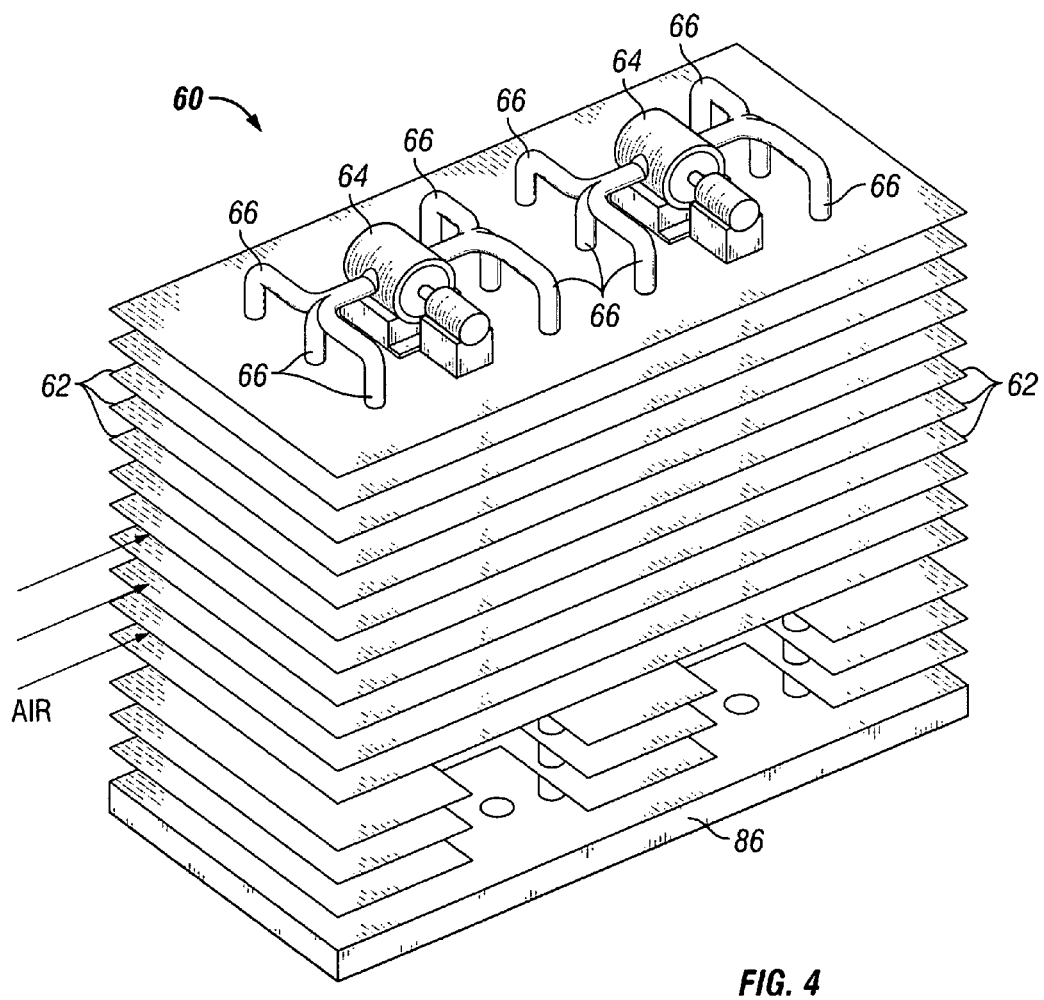
FIG. 4 shows a top-side view of a heat sink in accordance with an embodiment of the present invention.

FIG. 4 shows a top-side view of an exemplary heat sink 60 in accordance with an embodiment of the present invention. The heat sink 60 has, among other things, (i) a body portion formed of a plurality of fins 62 for dissipating heat, (ii) at least one motorized pump assembly 64, (iii) at least one pipe 66 operatively connected to/with the motorized pump assembly 64, and a (iv) base plate 86 for attachment to a heat source (e.g., an integrated circuit) (not shown).

The heat sink 60 uses the motorized pump assembly 64 and pipe 66 to propagate ferrofluid toward and away from the heat source (not shown). As described above, a "ferrofluid" is a fluid that contains magnetic particles. In one or more embodiments of the present invention, ferrofluid used in the heat sink 60 may be thermally conductive. Further, those skilled in the art will note that in one or more embodiments of the present invention, the magnetic particles in the ferrofluid may have some thermal conductivity.

Ferrofluid carried away from the heat source (not shown) toward and through the body portion of the heat sink 60 is "cooled" (i.e., removed of some amount of heat) by air flowing across fins 62 (exemplary direction of air flow indicated by arrows). Ferrofluid "cooled" using the fins 62 enters the motorized pump assembly 64 and is then directed back toward the heat source (not shown) through the body portion of the heat sink 60, which results in further "cooling" of the ferrofluid as the ferrofluid flows toward the heat source (not shown).

In one or more embodiments of the present invention, the flow of air across fins 62 may be controlled with, for example, fans or vents (not shown). Further, in one or more embodiments of the present invention, the temperature of air flowing across fins 62 may be controlled.

In one or more embodiments of the present invention, at least portions of any one of the fins 62, the pipe 66, and the base plate 86 may be formed of a thermally conductive metal such as, for example, copper.

Further, in one or more embodiments of the present invention, the pipe 66 may be integral with the body portion of the heat sink 60. For example, the pipe 66 may be solder bonded to the body portion of the heat sink 60.

Figure 5A:
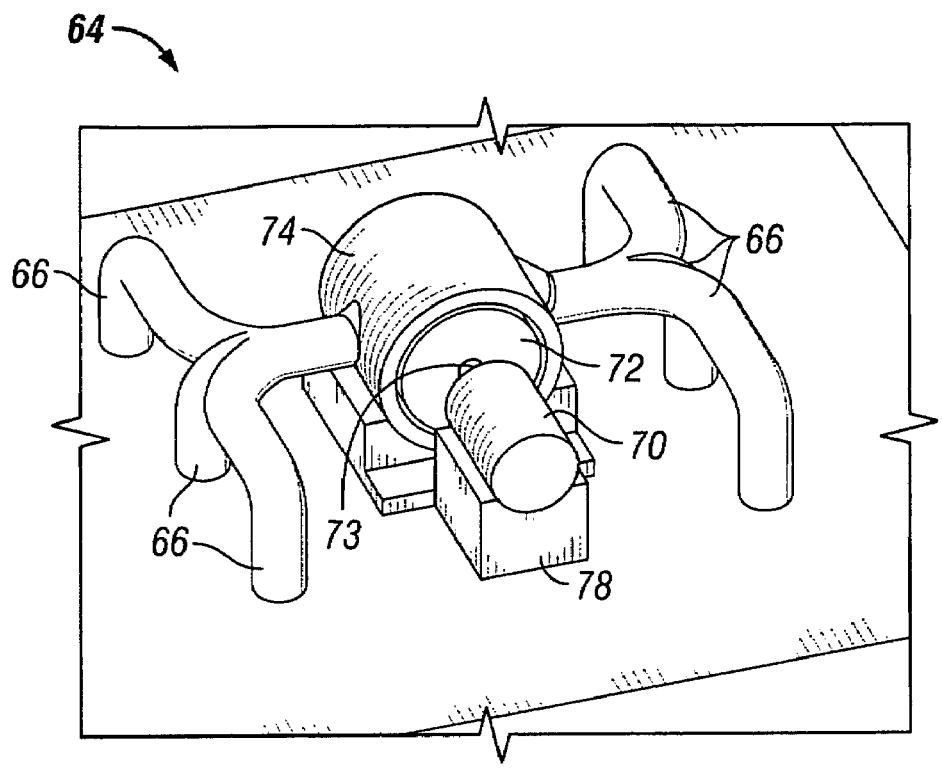
FIG. 5A shows a portion of a heat sink in accordance with an embodiment of the present invention.
Figure 5B:
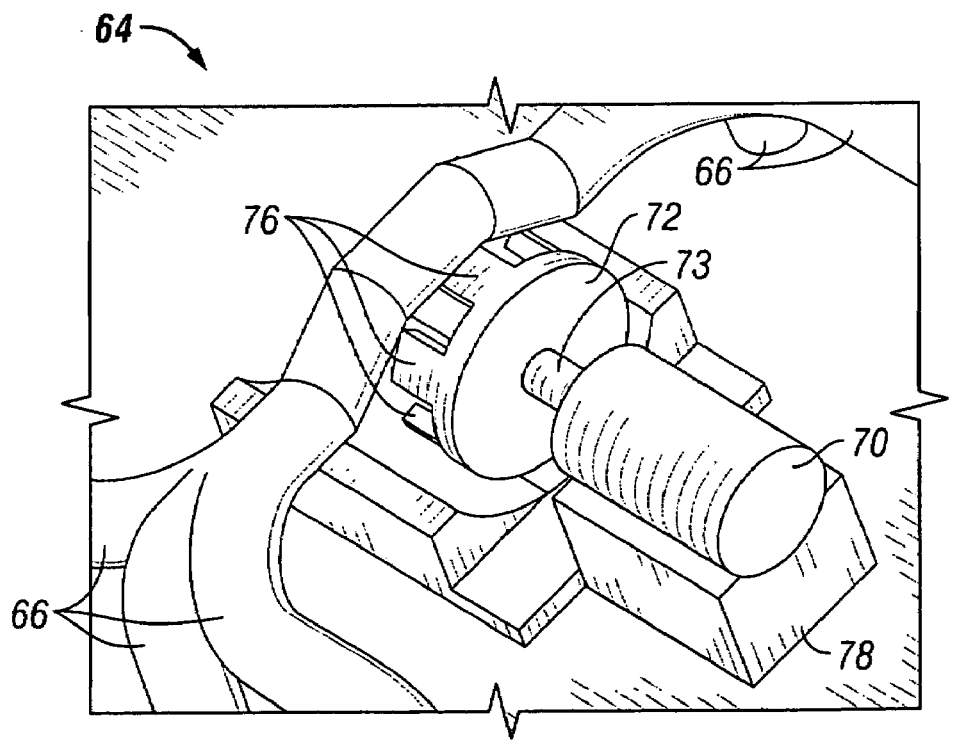
FIG. 5B shows a portion of a heat sink in accordance with an embodiment of the present invention.

The flow of ferrofluid within the heat sink 60 is controlled by the motorized pump assembly 64. FIGS. 5A and 5B show an exemplary motorized pump assembly 64 in accordance with an embodiment of the present invention. The motorized pump assembly 64 is formed of (i) a motor 70, (ii) a circular metal piece/plate 72 that is connected to the motor 70 via a shaft 73, (iii) a shield 74, and (iv) magnets 76 attached to and/or integral with the circular metal piece/plate 72 (FIG. 5B shows the motorized pump assembly 64 without the shield 74 for purposes of showing the magnets 76).

As described further below, the magnets 76 are used to induce a magnetic field. Accordingly, in one or more embodiments of the present invention, the shield 74 may be formed of a ferromagnetic material so as to prevent or reduce the leakage of the magnetic field from the motorized pump assembly 64. The ferromagnetic material may be, for example, iron, nickel, or cobalt.

Figure 5C:
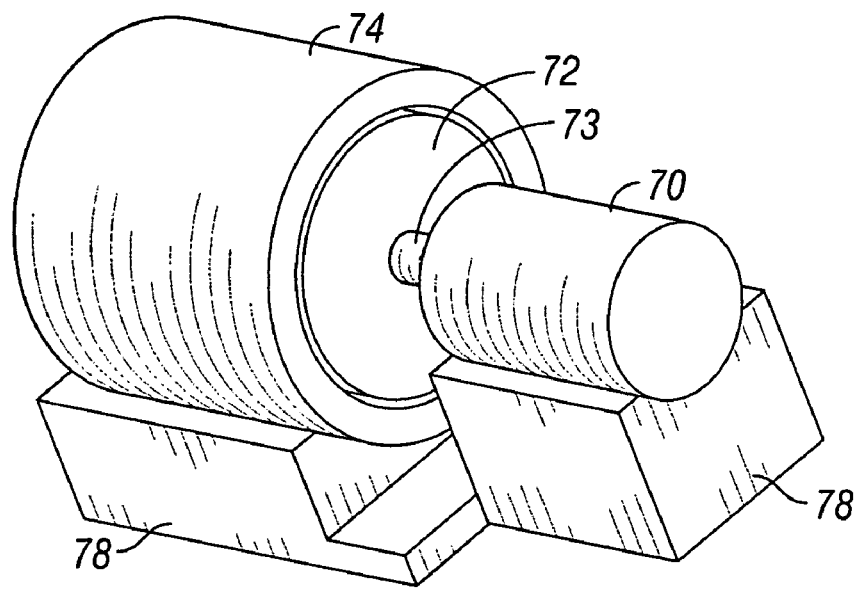
FIG. 5C shows a portion of a heat sink in accordance with an embodiment of the present invention.
Figure 5D:
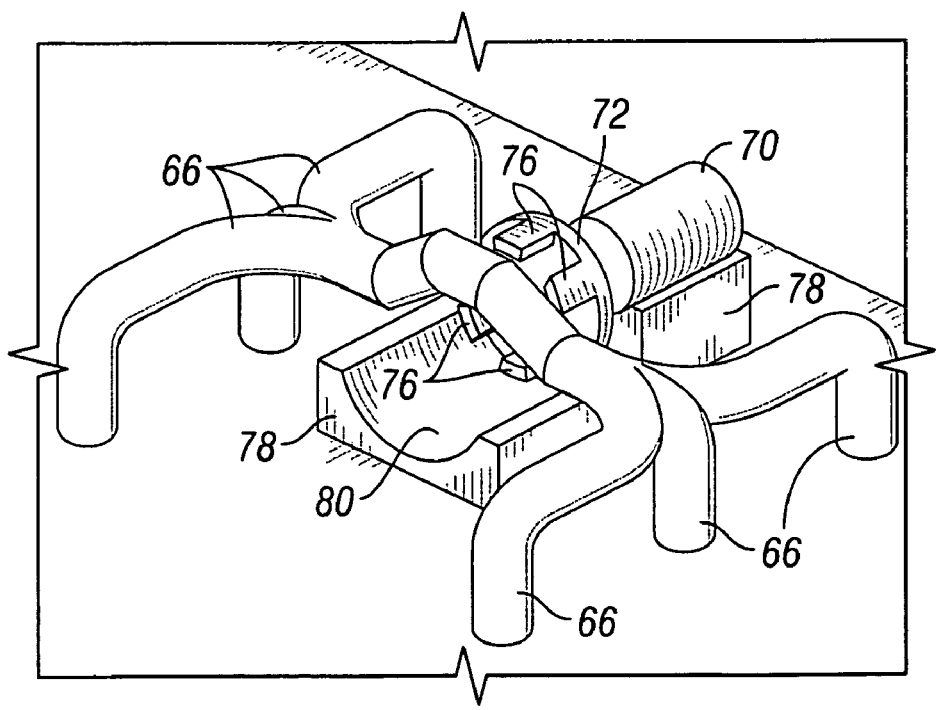
FIG. 5D shows a portion of a heat sink in accordance with an embodiment of the present invention.

Referring now to FIG. 5C, the motorized pump assembly 64 is secured to the heat sink 60 by a support member 78. The support member 78 is attached to a body portion of the heat sink 60. In one or more other embodiments of the present invention, the support member 78 may be integral with the body portion of the heat sink 60. Further, as shown in FIG. 5D, the support member 78 may be formed with a recess 80 for fitting a shape of the motorized pump assembly 64.

The motorized pump assembly 64 may be attached to the support member 78 by any one of various means. For example, the motorized pump assembly 64 may be attached to the support member 78 by an adhesive. In one or more other embodiments of the present invention, a weight of the motorized pump assembly 64 may be sufficient enough to allow the motorized pump assembly 64 to securely rest atop the support member 78.

Figure 6:
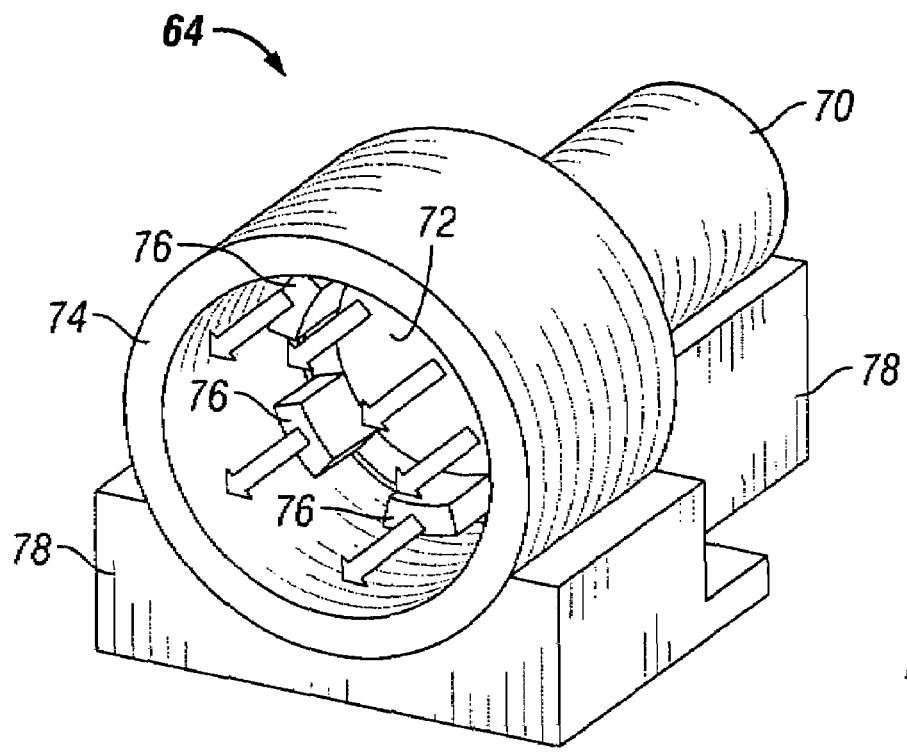
FIG. 6 shows a portion of a heat sink in accordance with an embodiment of the present invention.

The motorized pump assembly 64 uses magnets 76 to induce a magnetic field with magnetic particles in the ferrofluid to effectively "drive" the flow of ferrofluid in the heat sink 60. FIG. 6 shows an exemplary magnetization direction of magnets 76 (direction of magnetization indicated by arrows).

Figure 7:
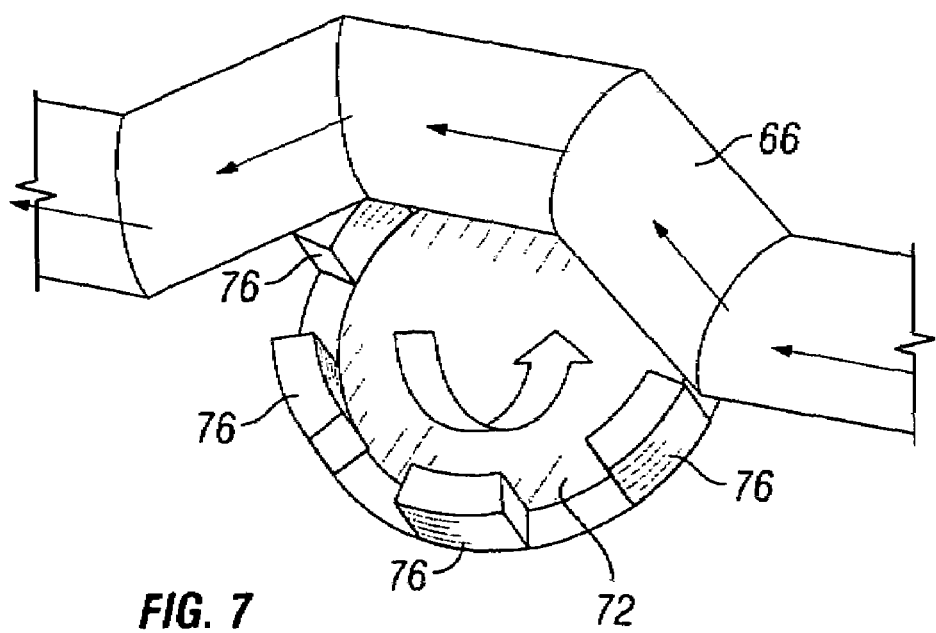
FIG. 7 shows a portion of a heat sink in accordance with an embodiment of the present invention.

The circular metal piece/plate 72 on which magnets 76 are disposed or are integral with is rotated (indicated by arrow) by the motor 70 as shown in FIG. 7.

Figure 8:
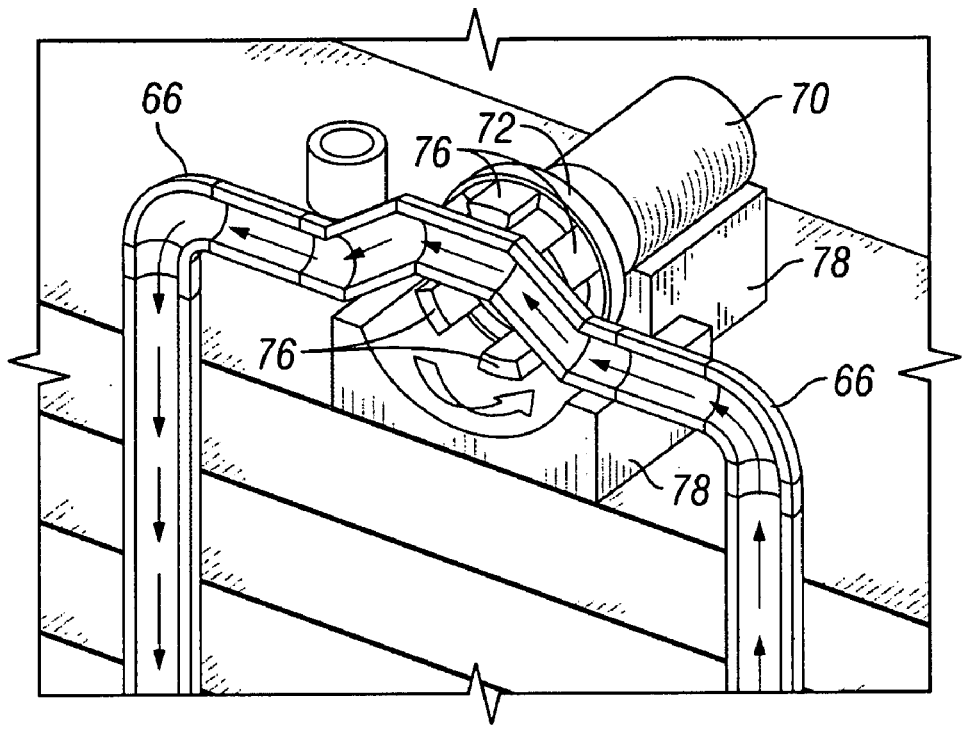
FIG. 8 shows a portion of a heat sink in accordance with an embodiment of the present invention.

In one or more embodiments of the present invention, pipe 66 carrying ferrofluid through the motorized pump assembly 64 traverses only a portion of the circular metal piece/plate 72. For example, in FIG. 7, pipe 66 traverses only about half of the region of the circular metal piece/plate 72. Moreover, those skilled in the art will note that pipe 66 carries ferrofluid along a peripheral region of the circular metal piece/plate 72 on which magnets 76 are located (i.e., pipe 66 does not carry ferrofluid across a central region of the circular metal piece/plate 72 as there are no magnets in such a central region). Accordingly, now also referring to FIG. 8, in such a manner, a magnetic field induced between magnets 76 and magnetic particles in the ferrofluid is moved by motor 70 so as to effectively drive the direction of flow of ferrofluid in pipe 66 (exemplary direction of flow of ferrofluid indicated by arrows in FIGS. 7 and 8).

Figure 9:
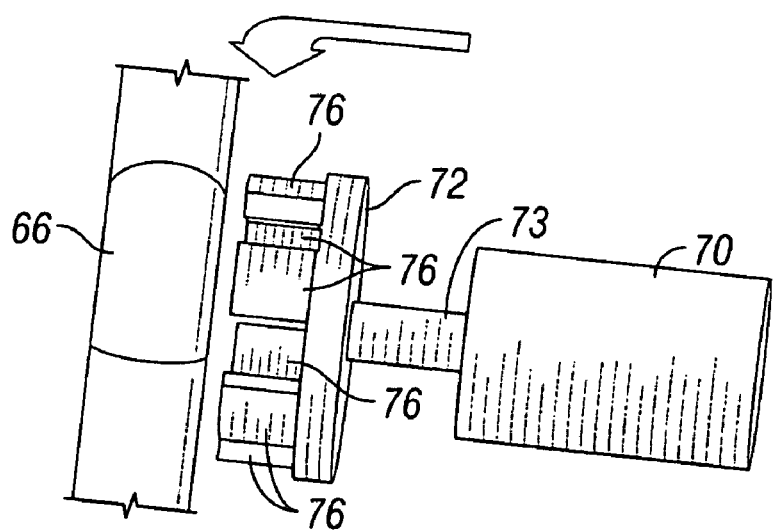
FIG. 9 shows a portion of a heat sink in accordance with an embodiment of the present invention.

As shown in FIG. 9, in an exemplary motorized pump assembly 64 in accordance with one or more embodiments of the present invention, there is no contact between the magnets 76 and the pipe 66 traversing the motorized pump assembly 64 (region of non-contact indicated by arrow).

Further, in one or more other embodiments of the present invention, the number, shape, size, strength, and/or arrangement of magnets may differ from that shown in FIGS. 5B, 5D, and 6-9.

Further, in one or more embodiments of the present invention, an optional valve (not shown) may be positioned within pipe 66 to ensure that ferrofluid in the pipe 66 flows in a single direction.

Figure 10A:
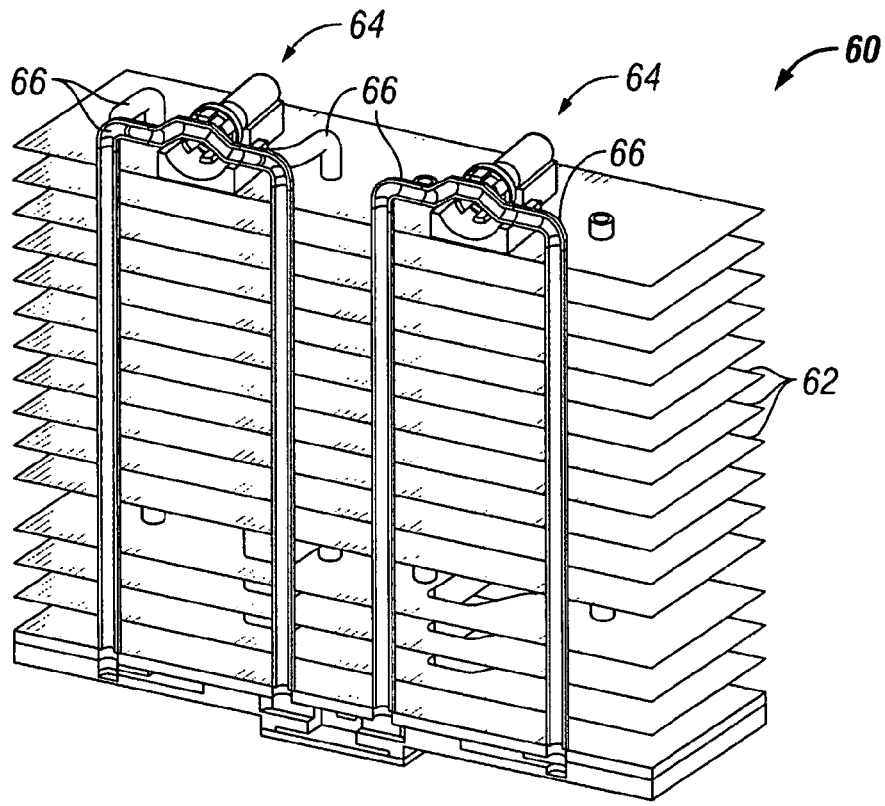
FIG. 10A shows a portion of a heat sink in accordance with an embodiment of the present invention.

FIG. 10A shows a portion of heat sink 60 in accordance with an embodiment of the present invention. Particularly, FIG. 10A shows a cross-section of heat sink 60 with "left" and "right" motorized pump assemblies 64 ("left" and "right" being from the perspective of a reader looking at FIG. 10A). The description of pump assemblies 64 in FIG. 10A as being "left" or "right" is only for purposes of description herein and are not intended to limit the scope of the claimed invention.

Figure 10B:
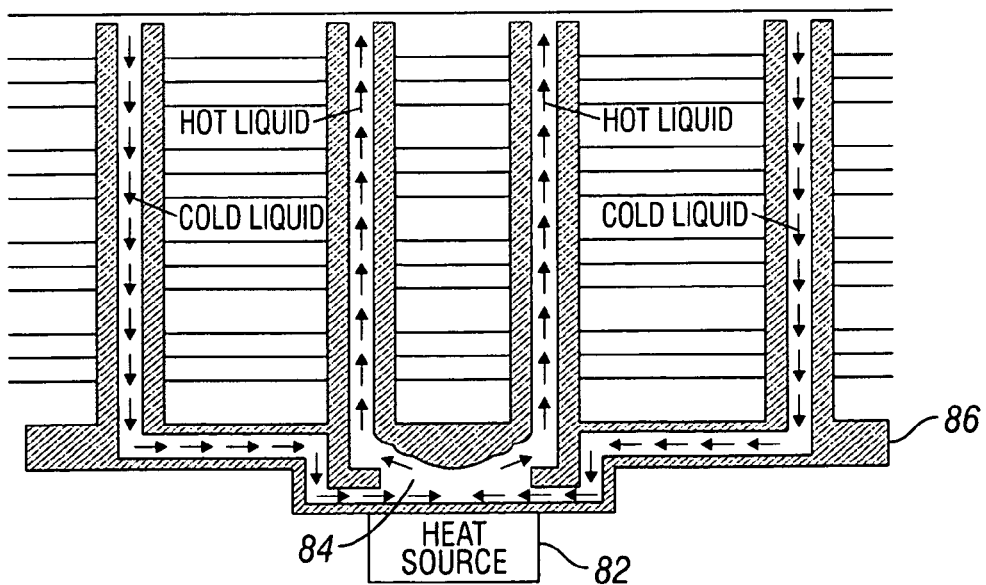
FIG. 10B shows a portion of a heat sink in accordance with an embodiment of the present invention.

The "left" and "right" motorized pump assemblies 64 in FIG. 10A are configured so as to effectuate particular ferrofluid flow direction as shown in FIG. 10B (exemplary direction of ferrofluid flow indicated by arrows). Those skilled in the art will note that to achieve the direction of ferrofluid flow shown in FIG. 10B, the motor of the "left" motorized pump assembly 64 in FIG. 10A rotates counter-clockwise, and the motor of the "right" motorized pump assembly 64 in FIG. 10A rotates clockwise.

By controlling the direction of ferrofluid flow using the motorized pump assemblies 64 in FIG. 10A as shown, for example, in FIG. 10B, cooled ferrofluid may be directed toward a heat source and ferrofluid heated by a heat source may be directed away from the heat source. As described above, in one or more embodiments of the present invention, ferrofluid in heat sink 60 is thermally conductive and, accordingly, absorbs heat generated by a heat source and dissipates the heat to outside air via, for example, the fins 62 of heat sink 60.

Referring more generally to FIG. 10B, a plurality of pump assemblies (not shown) may be used to circulate fluid (flow indicated by arrows) such that ferrofluid cooled via propagation through heat sink 60 is directed toward a heat source 82 and ferrofluid heated by the heat source 82 is directed away from the heat source 82 for subsequent heat transfer to the heat sink 60 itself. As shown in FIG. 10B, "cool" ferrofluid flows to and "heated" ferrofluid flows away from a fluid pool 84 disposed over the heat source 82.

Figure 11:
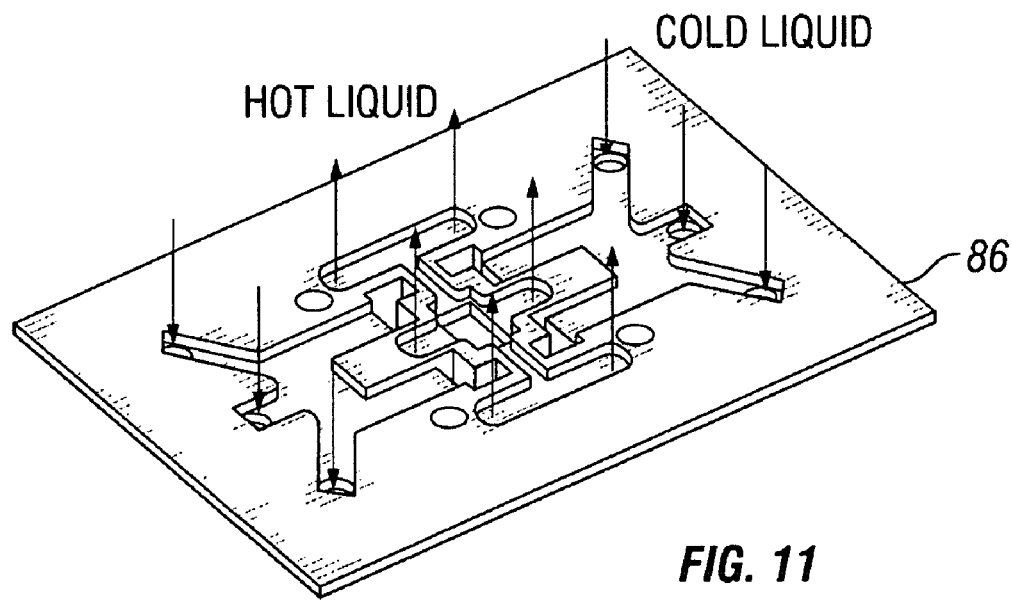
FIG. 11 shows a portion of a heat sink in accordance with an embodiment of the present invention.

Ferrofluid flow shown in FIG. 10B may be further facilitated by use of base plate 86 and a particular channel configuration within the heat sink 60. For example, FIG. 11 shows a possible configuration of base plate 86 (potential fluid flow indicated by arrows) that may be used to effectuate the ferrofluid flow shown in FIG. 10B. Further, FIG. 12 shows a possible configuration along a bottom portion of heat sink 60 (potential fluid flow indicated by arrows) that may be used to effectuate the fluid flow shown in FIG. 10B.

Figure 12:
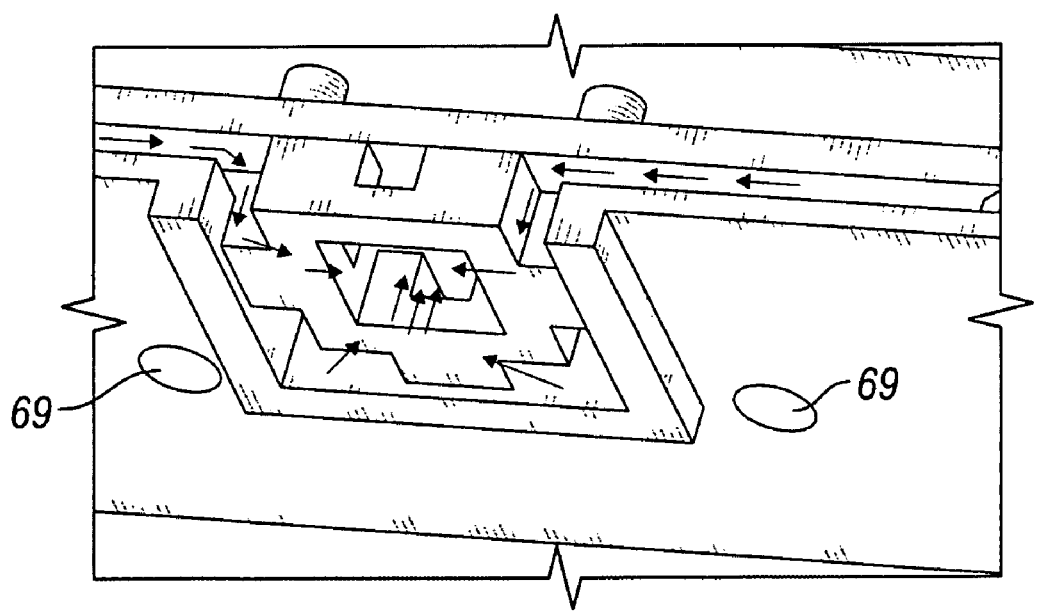
FIG. 12 shows a portion of a heat sink in accordance with an embodiment of the present invention.

Further, as shown in FIG. 12, holes 69 may be provided along the base plate 86 for screws (not shown) or other means used for attaching the heat sink 60 to a heat source.

Advantages of the present invention may include one or more of the following. In one or more embodiments of the present invention, a relatively small motor may be used to drive ferrofluid flow within a heat sink.

In one or more embodiments of the present invention, torque load on a motor used to drive ferrofluid flow within a heat sink may be relatively small.

In one or more embodiments of the present invention, the motor rotation speed necessary to effectuate desired ferrofluid flow within a heat sink may be relatively low, thereby resulting in low power consumption.

In one or more embodiments of the present invention, a motorized pump assembly used to control ferrofluid flow within a heat sink may be simple and/or compact in design.

In one or more embodiments of the present invention, a motorized pump assembly used to drive ferrofluid flow in a heat sink is shielded so as to contain a magnetic field induced within the motorized pump assembly.

In one or more embodiments of the present invention, magnets in a motorized pump assembly are disposed in non-contact with a pipe arranged to carry ferrofluid through the motorized pump assembly, thereby preventing heat of the ferrofluid and pipe from damaging the magnet and motor of the motorized pump assembly.

In one or more embodiments of the present invention, a motorized pump assembly may be used to direct ferrofluid heated by a heat source away from the heat source and to direct "cooled" ferrofluid toward the heat source.

In one or more embodiments of the present invention, the rate of ferrofluid flow within a heat sink may be adjusted by increasing or decreasing the rotation speed of a motor used to induce a magnetic field in a motorized pump assembly.

In one or more embodiments of the present invention, a motor of a motorized pump assembly used to circulate ferrofluid in a heat sink may be easily repaired or replaced.

In one or more embodiments of the present invention, a motorized pump assembly drives ferrofluid flow within a heat sink with relatively now noise.

In one or more embodiments of the present invention, ferrofluid flow within a heat sink may be easily reversed by, for example, changing a direction of motor rotation in a motorized pump assembly used to drive ferrofluid flow within the heat sink.

In one or more embodiments of the present invention, a heat sink uses thermally conductive ferrofluid for conducting heat dissipated by an integrated circuit.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A computer system, comprising:
    an integrated circuit; and
    a heat sink operatively connected to the integrated circuit, the heat sink comprising:
        a pipe; and
        a motorized pump assembly through which the pipe is arranged to carry ferrofluid, the motorized pump assembly arranged to induce a magnetic field with at least one magnetic particle in the ferrofluid,
        wherein a direction of flow of the ferrofluid in the pipe lies on a plane of rotation of the magnetic field.

2. The computer system of claim 1, wherein the ferrofluid is thermally conductive.

3. The computer system of claim 1, the motorized pump assembly comprising:

a motor; and at least one magnet operatively connected to the motor, wherein the at least one magnet is arranged to induce the magnetic field.

4. The computer system of claim 3, wherein the direction of flow of the ferrofluid in the pipe is dependent on movement of the at least one magnet by the motor.

5. The computer system of claim 3, the motorized pump assembly further comprising:

a circular piece operatively connected to the motor and the at least one magnet.

6. The computer system of claim 5, wherein the motor is arranged to rotate the circular piece.

7. The computer system of claim 3, wherein the at least one magnet is not in contact with the pipe.

8. The computer system of claim 3, the motorized pump assembly further comprising:

at least one ferromagnetic metal piece arranged to shield the magnetic field.

9. The computer system of claim 8, wherein at least one of the motor and the at least one ferromagnetic metal piece is cylindrical in shape.

10. The computer system of claim 1, the heat sink further comprising:

a valve disposed within the pipe.

11. The computer system of claim 1, the heat sink further comprising:

a recessed portion arranged to hold ferrofluid over the integrated circuit, wherein the motorized pump assembly is further arranged to:

direct ferrofluid from the motorized pump assembly through the heat sink and to the recessed portion, and direct ferrofluid from the recessed portion through the heat sink to the motorized pump assembly.

12. A method of cooling an integrated circuit with a heat sink, comprising:

rotating a motor operatively connected to at least one magnet; and directing thermally conductive ferrofluid to propagate over a region of the heat sink attached to the integrated circuit in a direction in the plane of rotation of a magnetic field induced between the at least one magnet and at least one magnetic particle in the ferrofluid.

13. The method of claim 12, further comprising:

at least partially shielding the magnetic field.

14. The method of claim 12, further comprising:

directing the ferrofluid to propagate through the heat sink in a direction dependent on a direction of movement of the at least one magnet; and passing air through a portion of the heat sink to cool the ferrofluid.

15. A heat sink, comprising:

a body portion formed of a plurality of fins arranged to dissipate heat;

a motorized pump assembly disposed on a top surface of the body portion;

a copper pipe arranged to propagate thermally conductive ferrofluid from the body portion through the motorized pump assembly back to the body portion, wherein a direction of propagation of the ferrofluid in the copper pipe lies on a plane of rotation of a magnetic field induced between the motorized pump assembly and at least one magnetic particle in the ferrofluid; and a base portion adapted to attach to an integrated circuit.

16. The heat sink of claim 15, the motorized pump assembly comprising:

a motor having a shaft operatively connected to a metal plate, the motor arranged to rotate the metal plate; and at least one magnet connected to the metal plate, wherein the magnetic field is induced between the at least one magnet and the at least one magnetic particle.

17. The heat sink of claim 16, wherein at least one of the motor and the metal plate is cylindrical in shape.

18. The heat sink of claim 16, wherein the copper pipe traverses only a portion of the metal plate.

19. The heat sink of claim 15, wherein the copper pipe is secured in the motorized pump assembly, and wherein the at least one magnet is not physically in contact with the copper pipe.

20. The heat sink of claim 15, further comprising:

a ferromagnetic metal piece arranged to shield the magnetic field.

* * * * *